United States Patent
Taniguchi

(10) Patent No.: US 10,749,498 B2
(45) Date of Patent: Aug. 18, 2020

(54) ELASTIC WAVE DEVICE, HIGH-FREQUENCY FRONT END CIRCUIT, AND COMMUNICATION DEVICE

(71) Applicant: Murata Manufacturing Co., Ltd., Nagaokakyo-shi, Kyoto-fu (JP)

(72) Inventor: Yasumasa Taniguchi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 17 days.

(21) Appl. No.: 16/261,667

(22) Filed: Jan. 30, 2019

(65) Prior Publication Data
US 2019/0158059 A1 May 23, 2019

Related U.S. Application Data

(63) Continuation of application No. PCT/JP2017/022715, filed on Jun. 20, 2017.

(30) Foreign Application Priority Data

Sep. 13, 2016 (JP) ................................ 2016-178352

(51) Int. Cl.
*H03H 9/145* (2006.01)
*H03H 9/02* (2006.01)
(Continued)

(52) U.S. Cl.
CPC ............. *H03H 9/1457* (2013.01); *H03F 1/56* (2013.01); *H03F 3/245* (2013.01);
(Continued)

(58) Field of Classification Search
CPC ............. H03H 9/1457; H03H 9/02858; H03H 9/02881; H03H 9/725; H03H 9/25;
(Continued)

(56) References Cited

U.S. PATENT DOCUMENTS 9,257,960 B2* 2/2016 Ruile .................. H03H 3/08
2011/0068655 A1 3/2011 Solal et al.
(Continued)

FOREIGN PATENT DOCUMENTS

JP 2011-101350 A 5/2011
JP 2013-518455 A 5/2013
(Continued)

OTHER PUBLICATIONS

Official Communication issued in International Patent Application No. PCT/JP2017/022715, dated Jul. 25, 2017.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave device includes an IDT electrode provided on a piezoelectric substrate and including a first end region including one end of the IDT electrode in an elastic wave propagation direction, a second end region including the other end of the IDT electrode in the elastic wave propagation direction, and an inner region that is located farther toward an inside than the first and second end regions in the elastic wave propagation direction, includes first and second high-acoustic-velocity regions, and a center region and first and second low-acoustic-velocity regions, located in the crossing region. The mass of the IDT electrode in the crossing region in the first and second end regions is smaller than the mass of the IDT electrode in the crossing region in the inner region.

20 Claims, 8 Drawing Sheets

(51) Int. Cl.
*H03H 9/25* (2006.01)
*H03F 1/56* (2006.01)
*H03F 3/24* (2006.01)
*H03H 9/72* (2006.01)

(52) U.S. Cl.
CPC .... *H03H 9/02559* (2013.01); *H03H 9/02637* (2013.01); *H03H 9/02858* (2013.01); *H03H 9/02866* (2013.01); *H03H 9/02881* (2013.01); *H03H 9/02992* (2013.01); *H03H 9/25* (2013.01); *H03H 9/725* (2013.01); *H03F 2200/451* (2013.01)

(58) Field of Classification Search
CPC ........... H03H 9/02992; H03H 9/02866; H03H 9/02637; H03H 9/02559; H03H 9/145; H03H 9/12; H03F 1/56; H03F 3/245; H03F 2200/451

USPC .......................................... 333/133, 193–196
See application file for complete search history.

(56) References Cited

U.S. PATENT DOCUMENTS

| | | |
|---|---|---|
| 2011/0199163 A1 | 8/2011 | Yamanaka |
| 2012/0161577 A1* | 6/2012 | Abbott ................. H03H 9/1452 310/313 C |
| 2013/0051588 A1 | 2/2013 | Ruile et al. |
| 2016/0336919 A1* | 11/2016 | Taniguchi .......... H03H 9/02559 |

FOREIGN PATENT DOCUMENTS

| | | |
|---|---|---|
| JP | 5221616 B2 | 6/2013 |
| WO | 2010/047114 A1 | 4/2010 |

* cited by examiner

ELASTIC WAVE DEVICE, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2016-178352 filed on Sep. 13, 2016 and is a Continuation Application of PCT Application No. PCT/JP2017/022715 filed on Jun. 20, 2017. The entire contents of each application are hereby incorporated herein by reference.

BACKGROUND OF THE INVENTION

1. Field of the Invention

The present invention relates to an elastic wave device that utilizes a piston mode, a high-frequency front end circuit, and a communication device.

2. Description of the Related Art

Heretofore, an elastic wave device has been proposed that utilizes a piston mode in order to suppress an unwanted wave.

For example, Japanese Patent No. 5221616 discloses an example of an elastic wave device that utilizes a piston mode. This elastic wave device includes a crossing region in which a plurality of first electrode fingers and a plurality of second electrode fingers of an IDT electrode are superposed with each other when viewed in an elastic wave propagation direction. The crossing region includes a center region that is located in the center in the direction in which the first and second electrode fingers extend and first and second edge regions that are provided on both sides of the center region in the direction in which the first and second electrode fingers extend.

In the first and second edge regions, a dielectric film or a metal film is stacked on the first and second electrode fingers and the electrode width (duty) of the edge regions is increased. Consequently, the acoustic velocity in the first and second edge regions is lower than the acoustic velocity in the center region and in regions outside the first and second edge regions. In this manner, the energy of elastic waves is confined and unwanted waves are suppressed.

There is a problem with an elastic wave device that utilizes a piston mode such as that disclosed in Japanese Patent No. 5221616 in that since the energy of an unwanted wave is also readily confined close to the surface of the piezoelectric body, a large unwanted wave is generated between a resonant frequency and an anti-resonant frequency (inside the pass band in the case of a filter).

SUMMARY OF THE INVENTION

Preferred embodiments of the present invention provide elastic wave devices, high-frequency front end circuits, and communication devices that effectively confine an elastic wave that is to be utilized and reduce or prevent an unwanted wave.

An elastic wave device according to a preferred embodiment of the present invention includes a piezoelectric body and an IDT electrode provided on the piezoelectric body. The IDT electrode includes a first busbar and a second busbar that face each other, a plurality of first electrode fingers including first ends that are connected to the first busbar, and a plurality of second electrode fingers including first ends that are connected to the second busbar and that are interdigitated with the plurality of first electrode fingers. The IDT electrode includes a first end region that includes one end of the IDT electrode in an elastic wave propagation direction, a second end region that includes another end of the IDT electrode in the elastic wave propagation direction, and an inner region that is located inside from the first end region and the second end region in the elastic wave propagation direction, and includes a crossing region that is a portion of the IDT electrode in which the first electrode fingers and the second electrode fingers are superposed with each other in the elastic wave propagation direction. When a direction in which the first electrode fingers and the second electrode fingers extend is referred to as a length direction, in the crossing region in at least the inner region, the IDT electrode includes a center region that is centrally located in the length direction and a first low-acoustic-velocity region and a second low-acoustic-velocity region that are disposed on both sides of the center region in the length direction and in which an acoustic velocity is lower than in the center region. The IDT electrode includes a first high-acoustic-velocity region between the first busbar and the first low-acoustic-velocity region and in which an acoustic velocity is higher than in the center region and a second high-acoustic-velocity region between the second busbar and the second low-acoustic-velocity region and in which an acoustic velocity is higher than in the center region. The mass of the IDT electrode in the crossing region in the first end region and/or the mass of the IDT electrode in the crossing region in the second end region is smaller than the mass of the IDT electrode in the crossing region in the inner region.

In an elastic wave device according to a preferred embodiment of the present invention, the IDT electrode includes the center region, the first low-acoustic-velocity region, and the second low-acoustic-velocity region in the crossing region in the inner region, the first end region, and the second end region.

In an elastic wave device according to a preferred embodiment of the present invention, the duty in the center region in the first end region and/or the second end region is smaller than the duty in the center region in the inner region (i.e., the duty of the electrode fingers of the IDT electrode, referred to hereinafter as simply "duty"). In this case, an unwanted wave is further reduced or prevented.

In an elastic wave device according to a preferred embodiment of the present invention, the duty close to the first low-acoustic-velocity region and close to the second low-acoustic-velocity region in the center region in the first end region and/or the second end region is smaller than the duty in the center region in the inner region. In this case, an unwanted wave is further reduced or prevented.

In an elastic wave device according to a preferred embodiment of the present invention, in the IDT electrode, the duty in the center region in the first end region and/or the second end region gradually decreases in a direction toward to the outside in the elastic wave propagation direction. In this case, an unwanted wave is further reduced or prevented, and a Rayleigh wave is less likely to leak.

In an elastic wave device according to a preferred embodiment of the present invention, in the IDT electrode, the duty in the first low-acoustic-velocity region and the duty in the second low-acoustic-velocity region in the first end region and the second end region are larger than the duties in the center region in the first end region and the second end region. In this case, the acoustic velocity in the first and second low-acoustic-velocity regions is able to be reduced.

In an elastic wave device according to a preferred embodiment of the present invention, an additional mass film is stacked on a plurality of portions of the first end region and second end region located in first low-acoustic-velocity region and the second low-acoustic-velocity region. In this case, the acoustic velocity in the first and second low-acoustic-velocity regions is able to be reduced.

In an elastic wave device according to a preferred embodiment of the present invention, the IDT electrode includes a plurality of first dummy electrode fingers that include first ends connected to the first busbar, that face the plurality of second electrode fingers with gaps therebetween, and that are provided in the first end region and/or the second end region, and a plurality of second dummy electrode fingers that include first ends connected to the second busbar, that face the plurality of first electrode fingers with gaps therebetween, and that are provided in the first end region and/or the second end region, and the first low-acoustic-velocity region and the second low-acoustic-velocity region are not arranged in the first end region and the second end region. In this case, an unwanted wave is further reduced or prevented.

In an elastic wave device according to a preferred embodiment of the present invention, the gaps between the plurality of first electrode fingers and the plurality of second dummy electrode fingers are superposed with the crossing region in the inner region when viewed in the elastic wave propagation direction, and the gaps between the plurality of second electrode fingers and the plurality of first dummy electrode fingers are superposed with the crossing region in the inner region when viewed in the elastic wave propagation direction. In this case, an unwanted wave is more effectively reduced or prevented.

In an elastic wave device according to a preferred embodiment of the present invention, the mass of the IDT electrode in the crossing region in the first end region and the mass of the IDT electrode in the crossing region in the second end region are smaller than the mass of the IDT electrode in the crossing region in the inner region, the first dummy electrode fingers and the second dummy electrode fingers are provided in the first end region and the second end region, and the plurality of first dummy electrode fingers have different lengths from each other in the first end region, the plurality of first dummy electrode fingers have different lengths from each other in the second end region, the plurality of second dummy electrode fingers have different lengths from each other in the first end region, and the plurality of second dummy electrode fingers have different lengths from each other in the second end region, and the lengths of the plurality of first dummy electrode fingers and the lengths of the second dummy electrode fingers increase the closer the dummy electrode fingers are to the outside in the elastic wave propagation direction. In this case, an unwanted wave is further reduced or prevented.

In an elastic wave device according to a preferred embodiment of the present invention, the mass of the IDT electrode in the crossing region in the first end region and the mass of the IDT electrode in the crossing region in the second end region are smaller than the mass of the IDT electrode in the crossing region in the inner region. In this case, an unwanted wave is further reduced or prevented.

In an elastic wave device according to a preferred embodiment of the present invention, the area of the first end region and the area of the second end region each occupy about 2% to about 5% of the area of the IDT electrode. In this case, an unwanted wave is effectively reduced or prevented.

In an elastic wave device according to a preferred embodiment of the present invention, a Rayleigh wave is utilized. In this case, preferred embodiments of the present invention are particularly suitably applied.

A high-frequency front end circuit according to a preferred embodiment of the present invention includes an elastic wave device according to a preferred embodiment of the present invention and a power amplifier.

A communication device according to a preferred embodiment of the present invention includes a high-frequency front end circuit according to a preferred embodiment of the present invention and an RF signal processing circuit.

According to preferred embodiments of the present invention, elastic wave devices, high-frequency front end circuits, and communication devices that effectively confine an elastic wave that is to be utilized and that reduce or prevent an unwanted wave are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described with reference to the accompanying drawings.

The preferred embodiments described in the present specification are illustrative examples and it should be noted that portions of the configurations illustrated in different preferred embodiments may be substituted for one another or combined with one another.

Figure 1:
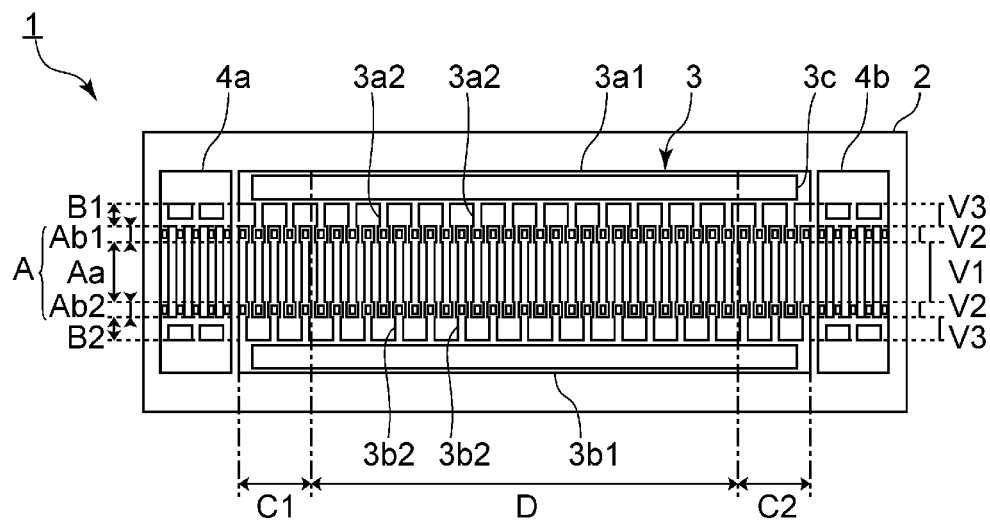
FIG. 1 is a schematic plan view of an elastic wave device according to a first preferred embodiment of the present invention.

FIG. 1 is a schematic plan view of an elastic wave device according to a first preferred embodiment of the present invention.

An elastic wave device 1 includes a piezoelectric substrate 2 as a piezoelectric body. The piezoelectric substrate 2 is preferably made of, for example, 128.5° Y-cut X-propagation $LiNbO_3$. The cut angle of the piezoelectric substrate 2 is not limited to this example. Furthermore, the material of the piezoelectric substrate 2 is not limited to the above example, and may instead be a piezoelectric single crystal, such as $LiTaO_3$ or a suitable piezoelectric ceramic, for example.

An IDT electrode 3 is provided on the piezoelectric substrate 2. The IDT electrode 3 includes first and second busbars 3a1 and 3b1 and a plurality of first and second electrode fingers 3a2 and 3b2. The first and second busbars 3a1 and 3b1 face each other. First ends of the plurality of first electrode fingers 3a2 are connected to the first busbar 3a1. First ends of the plurality of second electrode fingers 3b2 are connected to the second busbar 3b1. The plurality of first and second electrode fingers 3a2 and 3b2 are interdigitated with each other.

The first and second busbars 3a1 and 3b1 include a lower layer electrode that is stacked on the piezoelectric substrate 2 and an upper layer electrode 3c that is stacked on the lower layer electrode. Electrical resistance is able to be reduced in this manner. The first and second busbars 3a1 and 3b1 do not have to include the upper layer electrode 3c.

An elastic wave is excited by applying an alternating-current voltage to the IDT electrode 3. Although not particularly restricted, the elastic wave device 1 preferably utilizes Rayleigh waves, for example. In this case, preferred embodiments of the present invention are particularly suitably applied.

Reflectors 4a and 4b are provided on both sides of the IDT electrode 3 in an elastic wave propagation direction. In the present preferred embodiment, although not particularly restricted, the plurality of first and second electrode fingers 3a2 and 3b2 include 100 pairs of electrode fingers, and the pluralities of electrode fingers of the reflectors 4a and 4b each include 21 electrode fingers. In FIG. 1, the IDT electrode 3 and the reflectors 4a and 4b are illustrated in a schematic manner, and the number of pairs of electrode fingers and the numbers of electrode fingers are different from those described above. The same also applies to FIGS. 9 and 12 described later.

As represented by the one-dot chain lines in FIG. 1, the IDT electrode 3 includes a first end region C1 that includes one end of the IDT electrode 3 in the elastic wave propagation direction and a second end region C2 that includes the other end of the IDT electrode 3 in the elastic wave propagation direction. The IDT electrode 3 includes an inner region D that is located farther toward the inside than the first and second end regions C1 and C2 in the elastic wave propagation direction.

More specifically, the first and second end regions C1 and C2 each include two pairs of the first and second electrode fingers 3a2 and 3b2. The first end region C1 includes five electrode fingers from the electrode fingers located closest to the reflector 4a. The second end region C2 includes five electrode fingers from the electrode fingers located closest to the reflector 4b. Thus, in the present preferred embodiment, preferably, the areas of the first and second end regions C1 and C2 each occupy, for example, about 2% of the IDT electrode 3. It is sufficient that the areas of the first and second end regions C1 and C2 each occupy about 20% or less of the area of the IDT electrode 3.

The IDT electrode 3 includes a crossing region A in which the first electrode fingers 3a2 and the second electrode fingers 3b2 are superposed with each other when viewed in the elastic wave propagation direction. Here, a direction in which the first and second electrode fingers 3a2 and 3b2 extend is referred to as a length direction. The crossing region A includes a center region Aa located in the center in the length direction. The crossing region A includes first and second low-acoustic-velocity regions Ab1 and Ab2 on both sides of the center region Aa in the length direction. The center region Aa is disposed between the first low-acoustic-velocity region Ab1 and the second low-acoustic-velocity region Ab2 in the length direction. The region between the first low-acoustic-velocity region Ab1 and the second low-acoustic-velocity region Ab2 is not included in the first low-acoustic-velocity region Ab1 and the second low-acoustic-velocity region Ab2. An acoustic velocity V2 in the first and second low-acoustic-velocity regions Ab1 and Ab2 is lower than an acoustic velocity V1 in the center region Aa.

The IDT electrode 3 includes a first high-acoustic-velocity region B1 between the first busbar 3a1 and the first low-acoustic-velocity region Ab1. An acoustic velocity V3 in the first high-acoustic-velocity region B1 is higher than the acoustic velocity V1 in the center region Aa. The IDT electrode 3 includes a second high-acoustic-velocity region B2 between the second busbar 3b1 and the second low-acoustic-velocity region Ab2. The acoustic velocity V3 in the second high-acoustic-velocity region B2 is higher than the acoustic velocity V1 in the center region Aa.

The relationship between the acoustic velocities V1, V2, and V3 is illustrated in FIG. 1. A higher acoustic velocity is illustrated as being located farther toward the right side in FIG. 1.

Here, λ represents the wavelength of an elastic wave defined by the electrode finger pitch of the IDT electrode 3. At this time, in the elastic wave device 1, the dimension of each of the first and second high-acoustic-velocity regions B1 and B2 in the length direction is preferably about 2λ, for example. The dimension of each of the first and second high-acoustic-velocity regions B1 and B2 in the length direction is not limited to this example.

In the present preferred embodiment, the crossing region A includes the center region Aa and the first and second low-acoustic-velocity regions Ab1 and Ab2 in the inner region D and the first and second end regions C1 and C2. It is sufficient that the crossing region A include the center region Aa and the first and second low-acoustic-velocity regions Ab1 and Ab2 in at least the inner region D.

Figure 2:
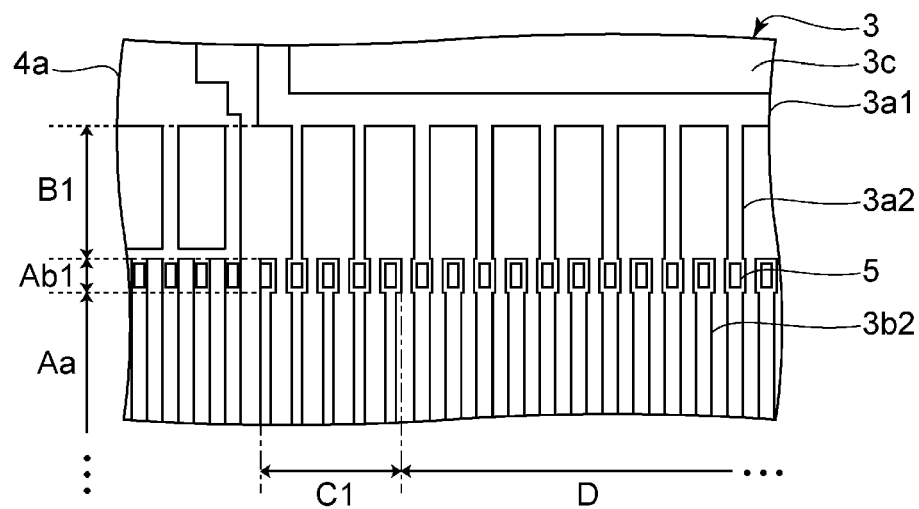
FIG. 2 is an enlarged plan view of the vicinity of a first end region of an IDT electrode in the first preferred embodiment of the present invention.

FIG. 2 is an enlarged plan view of the vicinity of the first end region of the IDT electrode in the first preferred embodiment.

The duty of the first low-acoustic-velocity region Ab1 is larger than the duty of the center region Aa in the IDT electrode 3. Consequently, the acoustic velocity in the first low-acoustic-velocity region Ab1 is able to be reduced. In addition, additional mass films 5 are stacked on the portions of the plurality of first and second electrode fingers 3a2 and 3b2 that are located in the first low-acoustic-velocity region Ab1. Consequently, the acoustic velocity in the first low-acoustic-velocity region Ab1 is able to be further reduced.

In the present preferred embodiment, the additional mass films 5 are preferably made of a suitable metal. The additional mass films 5 may instead be made of a dielectric or other suitable material. In the case in which the additional mass films 5 are made of a dielectric, the additional mass films 5 may have a strip shape that extends in the elastic wave propagation direction and the additional mass films 5 on adjacent electrode fingers may be integrated with each other.

The configuration used to reduce the acoustic velocity in the first low-acoustic-velocity region Ab1 is not particularly limited. For example, the additional mass films 5 do not have to be provided. Alternatively, the additional mass films 5 may be provided and the duty of the first low-acoustic-velocity region Ab1 and the duty of the center region Aa may be the same or substantially the same as each other.

In addition, the plurality of first and second electrode fingers 3a2 and 3b2 are configured in the second low-acoustic-velocity region in the same or substantially the same manner as in the first low-acoustic-velocity region Ab1.

Here, the duty of the center region Aa in the first end region C1 is smaller than the duty of the center region Aa in the inner region D. More specifically, the duty across the entire or substantially the entire center region Aa in the first end region C1 is smaller than the duty of the center region Aa in the inner region D. Therefore, the mass of the IDT electrode 3 in the crossing region in the first end region C1 is smaller than the mass of the IDT electrode 3 in the crossing region in the inner region D. In other words, the mass of the electrode fingers in the crossing region in the first end region C1 is smaller than the mass of the electrode fingers in the crossing region in the inner region D.

In addition, the second end region of the IDT electrode 3 is configured in the same or substantially the same manner as the first end region C1. The duty of the center region Aa in the second end region is smaller than the duty of the center region Aa in the inner region D. Therefore, the mass of the electrode fingers in the crossing region in the second end region is smaller than the mass of the electrode fingers in the crossing region in the inner region D.

The duty of the center region Aa in the first end region C1 and the second end region is not particularly limited, but is preferably, for example, about 0.4 in the present preferred embodiment. The duty of the center region Aa in the inner region D is not particularly limited but is preferably, for example, about 0.5 in the present preferred embodiment.

Returning to FIG. 1, in the present preferred embodiment, the mass of the electrode fingers in the crossing region A in the first and second end regions C1 and C2 is smaller than the mass of the electrode fingers in the crossing region A in the inner region D. Consequently, the elastic wave that is utilized is able to be effectively confined and an unwanted wave is reduced or prevented. This will be described below by comparing the present preferred embodiment and a comparative example.

Figure 3:
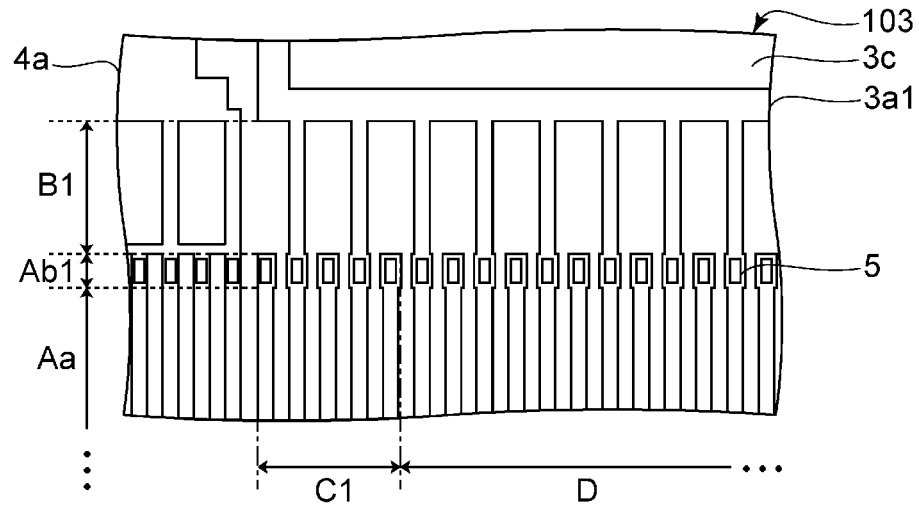
FIG. 3 is an enlarged plan view of the vicinity of a first end region of an IDT electrode in a comparative example.

As illustrated in FIG. 3, an elastic wave device of a comparative example differs from the first preferred embodiment in that the duty of a center region Aa in a first end region C1 and a second end region of an IDT electrode 103 and the duty of the center region Aa in an inner region D of the IDT electrode 103 are the same as each other. The mass of the electrode fingers in the crossing region in the first end region C1 and the second end region of the IDT electrode 103 is the same as the mass of the electrode fingers in the crossing region in the inner region D.

Figure 4:
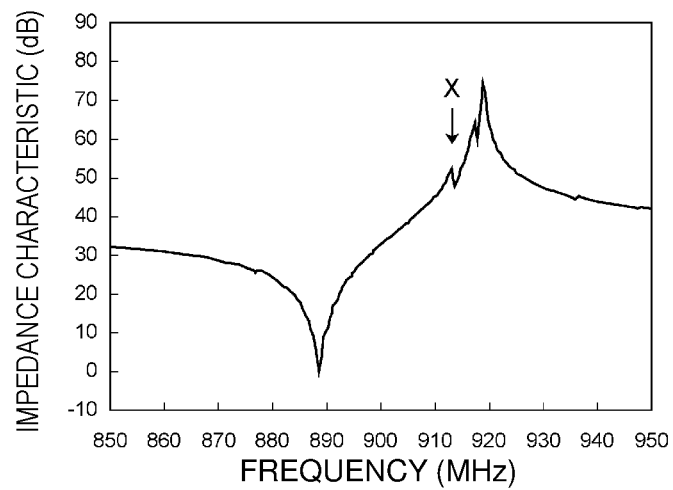
FIG. 4 is a diagram illustrating an impedance-frequency characteristic of an elastic wave device of the comparative example.
Figure 5:
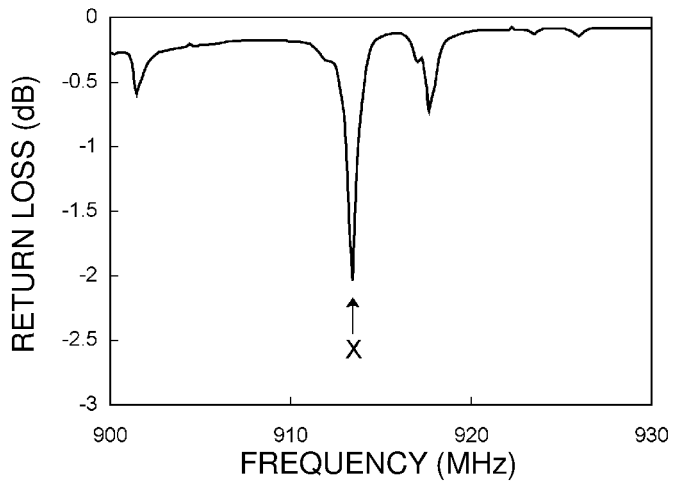
FIG. 5 is a diagram illustrating return loss of the elastic wave device of the comparative example.
Figure 6:
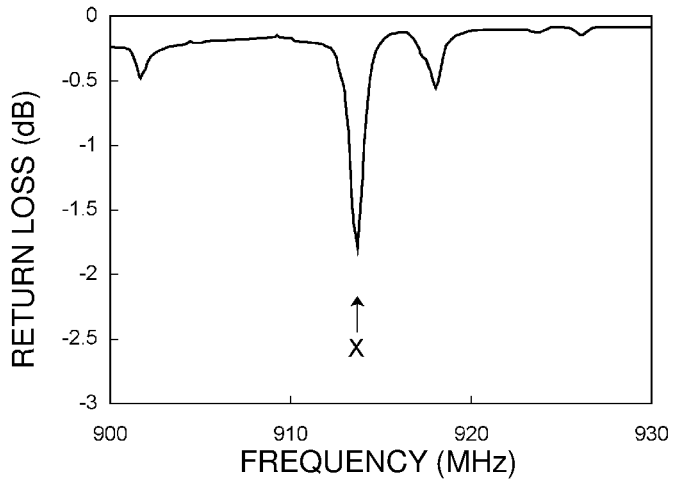
FIG. 6 is a diagram illustrating the return loss of the elastic wave device according to the first preferred embodiment of the present invention.

FIG. 4 is a diagram illustrating an impedance-frequency characteristic of the elastic wave device of the comparative example. FIG. 5 is a diagram illustrating return loss of the elastic wave device of the comparative example. FIG. 6 is a diagram illustrating the return loss of the elastic wave device according to the first preferred embodiment. Arrows X in FIGS. 4 to 6 indicate the frequency at which a shear horizontal wave is generated. This is also true for drawings illustrating impedance-frequency characteristics and drawings illustrating return losses referred to later.

As illustrated in FIGS. 4 and 5, it is clear that a shear horizontal wave, which is an unwanted wave, is generated between a resonant frequency and an anti-resonant frequency in the elastic wave device of the comparative example. As illustrated in FIG. 5, the return loss of the shear horizontal wave is about 2.05 dB in the comparative example.

In contrast, as illustrated in FIG. 6, the return loss of the shear horizontal wave is about 1.8 dB in the first preferred embodiment and it is clear that the return loss is improved compared with the comparative example. In the first preferred embodiment, the mass of the electrode fingers in the first and second end regions is small. Thus, it is thought that the shear horizontal wave is effectively allowed to leak in the thickness direction of the piezoelectric substrate. In addition, the energy density of a Rayleigh wave tends to be higher in the vicinity of the center of an IDT electrode. Therefore, even though the mass of the electrode fingers is smaller in the first and second end regions, it is difficult for the Rayleigh waves to leak out. Thus, the elastic wave that is utilized is able to be effectively confined and unwanted waves are reduced or prevented.

It is sufficient that the mass of the electrode fingers in the crossing region in the first end region or the mass of the electrode fingers in the crossing region in the second end region are smaller than the mass of the electrode fingers in the crossing region in the inner region. This is also true in the second to sixth preferred embodiments described below. However, it is preferable that the mass of the electrode fingers in the crossing region in the first end region and the mass of the electrode fingers in the crossing region in the second end region is smaller than the mass of the electrode fingers in the crossing region in the inner region. In this manner, unwanted waves are further reduced or prevented.

In the first preferred embodiment, the piezoelectric body is a piezoelectric substrate, but the piezoelectric body may instead be a piezoelectric thin film. For example, a low-acoustic-velocity film may be provided on the surface of a piezoelectric thin film on the opposite side from a surface of the piezoelectric thin film on which an IDT electrode is provided. A high-acoustic-velocity member may be provided on a surface of the low-acoustic-velocity film that is on the opposite side from the piezoelectric thin film.

Here, the low-acoustic-velocity film is a film in which the acoustic velocity of a propagating bulk wave is lower than the acoustic velocity of an elastic wave propagating along the piezoelectric thin film. For example, the low-acoustic-velocity film is preferably made of, for example, a material including a main component that is a compound obtained by adding fluorine, carbon, or boron to glass, silicon oxynitride, tantalum oxide, or silicon oxide. It is sufficient that the material of the low-acoustic-velocity film is a material having a relatively low acoustic velocity.

The high-acoustic-velocity member is a member in which the acoustic velocity of a propagating bulk wave is higher than the acoustic velocity of an elastic wave propagating along the piezoelectric thin film. For example, the high-acoustic-velocity member is preferably made of, for example, a material having aluminum nitride, aluminum oxide, silicon carbide, silicon oxynitride, a DLC film or diamond as a main component. In addition, it is sufficient that the material of the high-acoustic-velocity member be a material having a relatively high acoustic velocity.

The high-acoustic-velocity member may be a high-acoustic-velocity film or may be a high-acoustic-velocity substrate. When a low-acoustic-velocity film and a high-acoustic-velocity member are provided in this manner, the energy of elastic waves is able to be effectively confined.

Figure 7:
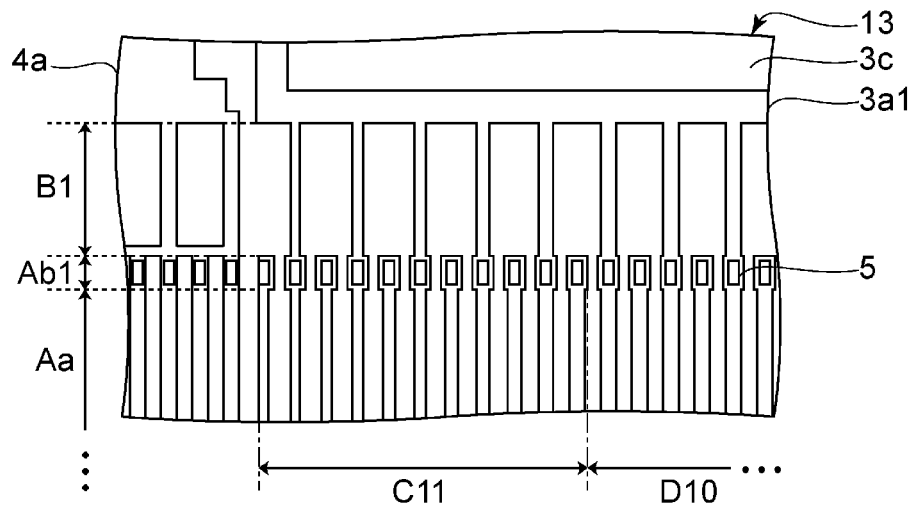
FIG. 7 is an enlarged plan view of the vicinity of a first end region of an IDT electrode in a second preferred embodiment of the present invention.

FIG. 7 is an enlarged plan view of the vicinity of a first end region of an IDT electrode in a second preferred embodiment of the present invention.

An elastic wave device according to a second preferred embodiment of the present invention differs from the first preferred embodiment in that the duty of a center region Aa gradually changes in a first end region C11 and a second end region of an IDT electrode 13. In addition, the areas of the first end region C11 and the second end region are different from those in the first preferred embodiment. In other respects, the elastic wave device according to the second preferred embodiment has the same or substantially the same configuration as the elastic wave device 1 of the first preferred embodiment. The duty in the center region Aa in an inner region D10 is preferably, for example, about 0.5 similarly to as in the first preferred embodiment.

More specifically, the first end region C11 and the second end region each include eleven electrode fingers. Thus, in the present preferred embodiment, the areas of the first end region C11 and the second end region each preferably occupy, for example, about 5% of the area of the IDT electrode 13. The areas of the first end region C11 and the second end region each preferably occupy, for example, about 5% or less of the area of the IDT electrode 13. Therefore, the elastic wave that is to be utilized is able to be effectively confined. In addition, the areas of the first end region C11 and the second end region preferably each preferably occupy, for example, at least about 2% of the area of the IDT electrode 13. In this manner, an unwanted wave is effectively reduced or prevented.

The duty of the center region Aa of the IDT electrode 13 gradually decreases in a direction toward the outside in the elastic wave propagation direction in the first end region C11 and the second end region. In the present preferred embodiment, the duty at the outermost points in the elastic wave propagation direction is preferably about 0.3, for example. However, the duty at the outermost points in the elastic wave propagation direction is not limited to this example.

Figure 8:
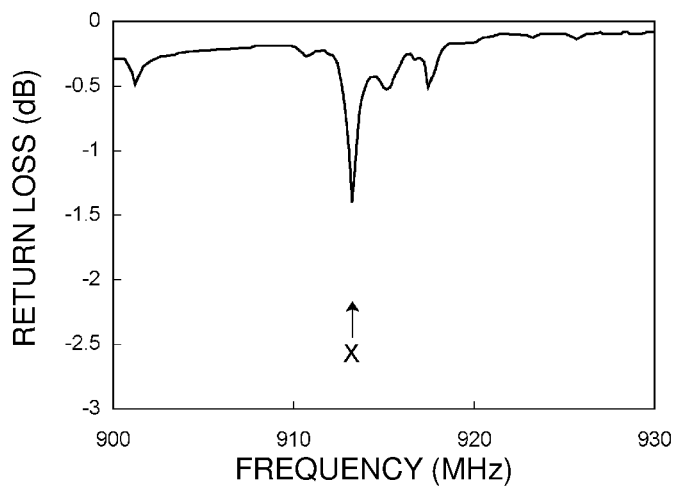
FIG. 8 is a diagram illustrating the return loss of an elastic wave device according to the second preferred embodiment of the present invention.

FIG. 8 is a diagram illustrating the return loss of the elastic wave device according to the second preferred embodiment.

As illustrated in FIG. 8, in the present preferred embodiment, the return loss of the shear horizontal wave is improved to about 1.41 dB. Thus, the shear horizontal wave is further reduced.

As described above, the energy density of a Rayleigh wave tends to be higher in the vicinity of the center of the IDT electrode. In the present preferred embodiment, in the first end region C11 and the second end region illustrated in FIG. 7, the duty increases and the mass of the electrode fingers increases in a direction toward the inside in the elastic wave propagation direction. As a result, a Rayleigh wave is less likely to leak. In addition, in the first end region C11 and the second end region, the duty decreases and the mass of the electrode fingers decreases in a direction toward the outside in the elastic wave propagation direction. Therefore, the shear horizontal wave is able to more easily leak.

Figure 9:
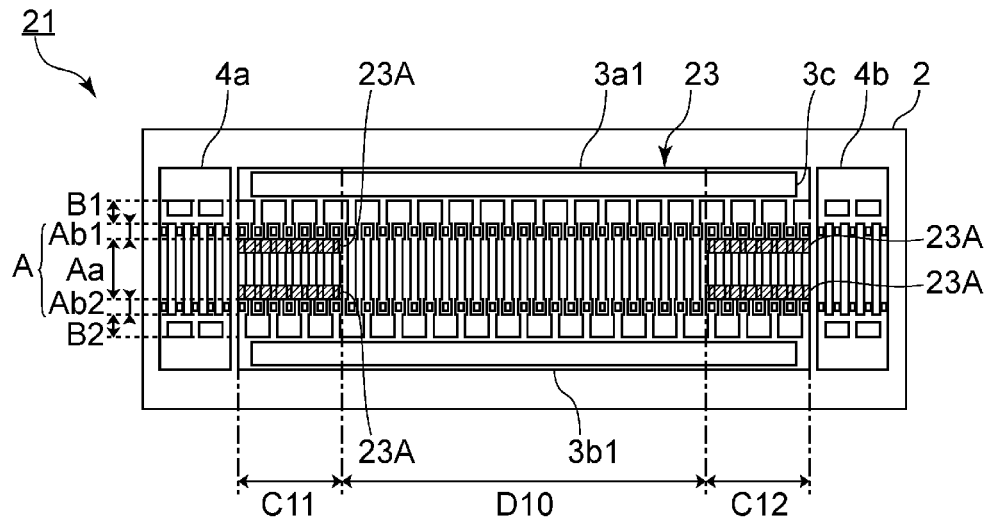
FIG. 9 is a schematic plan view of an elastic wave device according to a third preferred embodiment of the present invention.
Figure 10:
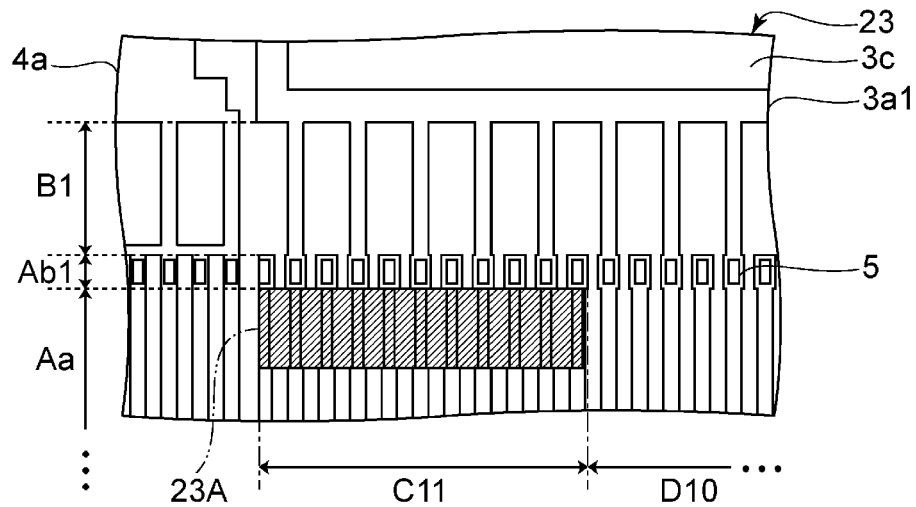
FIG. 10 is an enlarged plan view of the vicinity of a first end region of an IDT electrode in the third preferred embodiment of the present invention.

FIG. 9 is a schematic plan view of an elastic wave device according to a third preferred embodiment of the present invention. FIG. 10 is an enlarged plan view of the vicinity of a first end region of an IDT electrode in the third preferred embodiment.

As illustrated in FIG. 9, an elastic wave device 21 differs from the second preferred embodiment with respect to the configurations of first and second end regions C11 and C12 of an IDT electrode 23. More specifically, the elastic wave device 21 includes a plurality of small duty portions 23A, which are illustrated as portions with slanted hatching, in the first and second end regions C11 and C12 of the IDT electrode 23. Here, the small duty portions 23A are portions in which the duty is smaller than the duty in a center region Aa of an inner region D10. In other respects, the elastic wave device 21 has the same or substantially the same configuration as the elastic wave device of the second preferred embodiment.

The IDT electrode 23 includes four small duty portions 23A. The plurality of small duty portions 23A are disposed at the four corners of the center region Aa of the IDT electrode 23. More specifically, as illustrated in FIG. 10, one small duty portion 23A among the plurality of small duty portions 23A is disposed so as to include an end portion of the center region Aa on the first low-acoustic-velocity region Ab1 side in the first end region C11. In this manner, each small duty portion 23A is disposed so as to include an end portion of the center region Aa on the first low-acoustic-velocity region Ab1 side or an end portion of the center region Aa on the second low-acoustic-velocity region Ab2 side in the first and second end regions C11 and C12 illustrated in FIG. 9.

The length direction dimension of each small duty portion 23A is not particularly limited, and is preferably about 1.4λ, for example, in the present preferred embodiment. For example, preferably, the duty of each small duty portion 23A is about 0.4 and the duty of the first end region C11 other than in the plurality of small duty portions 23A is about 0.5, which is the same or substantially the same as that in the inner region D10. The duty of the plurality of small duty portions 23A is not limited to the above example.

Figure 11:
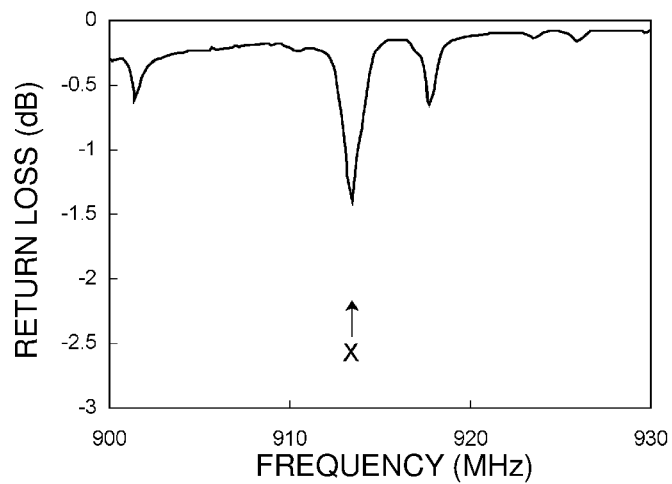
FIG. 11 is a diagram illustrating the return loss of an elastic wave device according to the third preferred embodiment of the present invention.

FIG. 11 is a diagram illustrating the return loss of the elastic wave device according to the third preferred embodiment.

As illustrated in FIG. 11, in the present preferred embodiment, the return loss of the shear horizontal wave is improved to about 1.41 dB. Thus, the duty in portions of the center region Aa in the first and second end regions C11 and C12 illustrated in FIG. 9 may be made smaller than the duty in the center region Aa of the inner region D10. In this case, the mass of the electrode fingers in the crossing region A in the first and second end regions C11 and C12 is smaller than the mass of the electrode fingers in the crossing region A in the inner region D10. Thus, a Rayleigh wave is able to be effectively confined and a shear horizontal wave, which is an unwanted wave, is further reduced or prevented.

In addition, the positions of the plurality of small duty portions 23A are not limited to the four corners of the center region Aa. The plurality of small duty portions 23A do not have to include an end portion of the center region Aa on the first low-acoustic-velocity region Ab1 side and do not have to include an end portion of the center region Aa on the second low-acoustic-velocity region Ab2 side. The number of locations at which the plurality of small duty portions 23A are provided is not limited to four locations.

It is preferable that the plurality of small duty portions 23A be disposed in portions of the center region Aa that are close to the first and second low-acoustic-velocity regions Ab1 and Ab2 in the first and second end regions C11 and C12. As a result, an unwanted wave, such as a shear horizontal wave, is further reduced or prevented. In this specification, "close to the first and second low-acoustic-velocity regions Ab1 and Ab2" means within a range of less than or equal to about ¼ of the length direction dimension of the center region Aa from the end portions of the center region Aa adjacent to the first and second low-acoustic-velocity regions Ab1 and Ab2.

The plurality of small duty portions 23A are more preferably disposed at the four corners of the center region Aa as in the present preferred embodiment. Consequently, an unwanted wave, such as a shear horizontal wave, is more effectively reduced or prevented.

Figure 12:
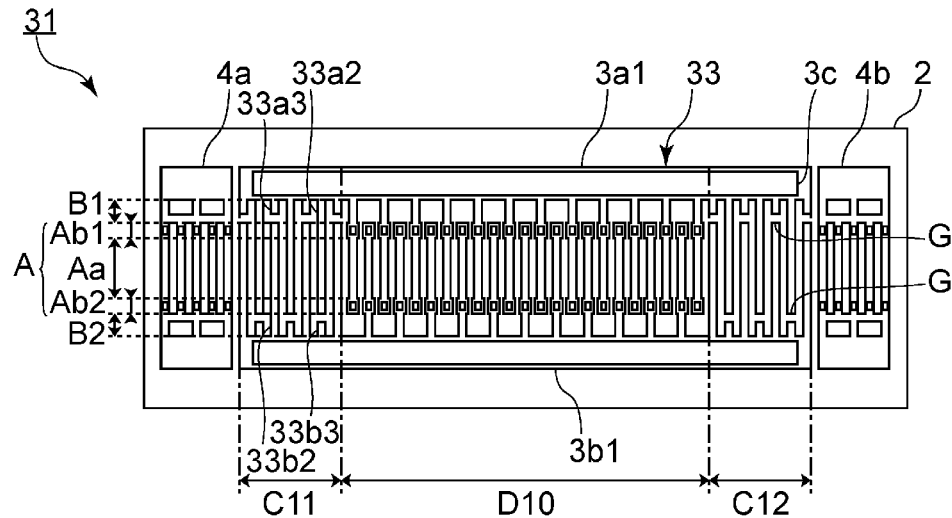
FIG. 12 is a schematic plan view of an elastic wave device according to a fourth preferred embodiment of the present invention.
Figure 13:
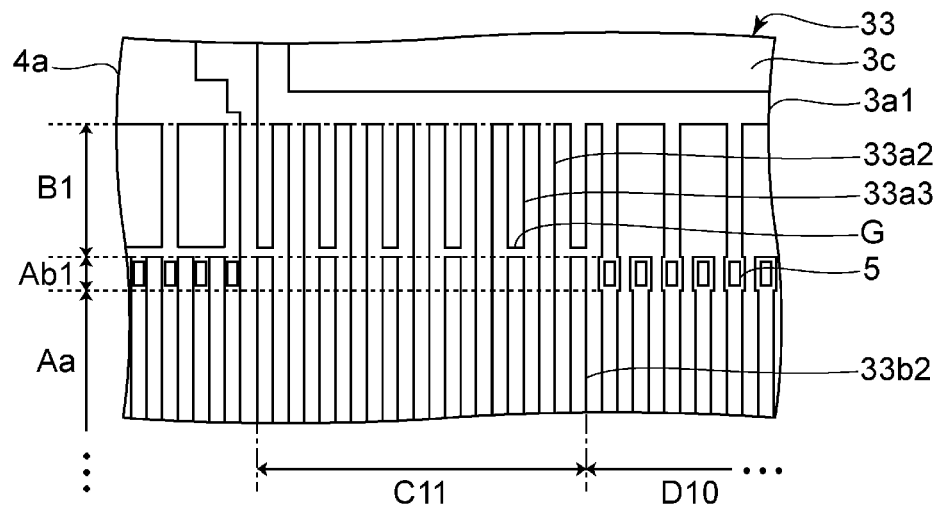
FIG. 13 is an enlarged plan view of the vicinity of a first end region of an IDT electrode in the fourth preferred embodiment of the present invention.

FIG. 12 is a schematic plan view of an elastic wave device according to a fourth preferred embodiment of the present invention. FIG. 13 is an enlarged plan view of the vicinity of a first end region of an IDT electrode in the fourth preferred embodiment.

As illustrated in FIG. 12, an elastic wave device 31 has the same or substantially the same configuration as the elastic wave device of the second preferred embodiment except for the configurations of the first and second end regions C11 and C12.

More specifically, in the elastic wave device 31, the first and second low-acoustic-velocity regions Ab1 and Ab2 are not provided in first and second end regions C11 and C12 of an IDT electrode 33. The duty in the crossing region A in the first and second end regions C11 and C12 of the IDT electrode 33 is the same or substantially the same as the duty in the crossing region A in the inner region D10.

The IDT electrode 33 includes a plurality of first and second dummy electrode fingers 33a3 and 33b3 in the first and second end regions C11 and C12. First ends of the plurality of first dummy electrode fingers 33a3 are connected to a first busbar 3a1 and the plurality of first dummy electrode fingers 33a3 face a plurality of second electrode fingers 33b2 with gaps therebetween. First ends of the plurality of second dummy electrode fingers 33b3 are connected to a second busbar 3b1 and the plurality of second dummy electrode fingers 33b3 face a plurality of first electrode fingers 33a2 with gaps therebetween.

Figure 14:
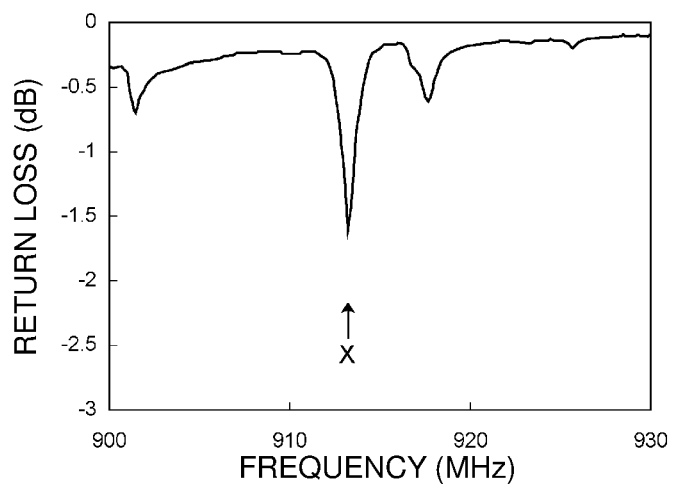
FIG. 14 is a diagram illustrating the return loss of an elastic wave device according to the fourth preferred embodiment of the present invention.

FIG. 14 is a diagram illustrating the return loss of the elastic wave device according to the fourth preferred embodiment.

As illustrated in FIG. 14, in the present preferred embodiment, the return loss of the shear horizontal wave is improved to about 1.61 dB. As illustrated in FIG. 13, the IDT electrode 33 does not include a first low-acoustic-velocity region Ab1 and a second low-acoustic-velocity region in a first end region C11, and therefore, the mass of the leading ends of the first and second electrode fingers 33a2 and 33b2 is small. The same is true for the second end region. Thus, the mass of electrode fingers in the crossing region in the first end region C11 and the second end region is effectively reduced and a shear horizontal wave is effectively allowed to leak. On the other hand, it is difficult for a Rayleigh wave to leak.

In addition, the first dummy electrode fingers 33a3 and the second dummy electrode fingers are provided outside the crossing region in the length direction. Thus, the mass of the electrode fingers in the regions between the first busbar 3a1 and the second busbar and the crossing region is able to be made large. Therefore, the shear horizontal wave is able to more easily leak.

Figure 15:
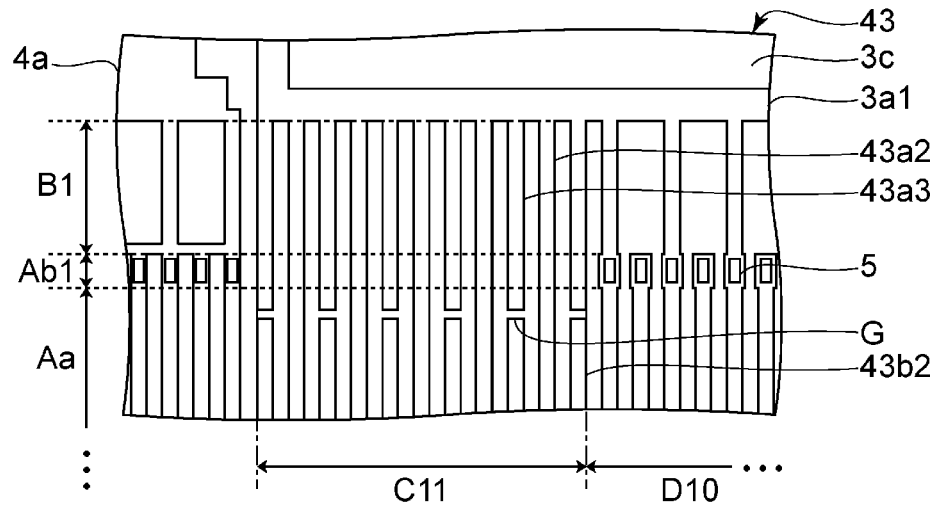
FIG. 15 is an enlarged plan view of the vicinity of a first end region of an IDT electrode in a fifth preferred embodiment of the present invention.

FIG. 15 is an enlarged plan view of the vicinity of a first end region of the IDT electrode in a fifth preferred embodiment of the present invention.

An elastic wave device according to a fifth preferred embodiment differs from the fourth preferred embodiment with respect to the positions of gaps between a plurality of first electrode fingers 43a2 and a plurality of second dummy electrode fingers and the position of gaps G between a plurality of second electrode fingers 43b2 and a plurality of first dummy electrode fingers 43a3 in an IDT electrode 43. In other respects, the elastic wave device according to the fifth preferred embodiment has the same or substantially the same configuration as the elastic wave device 31 of the fourth preferred embodiment.

More specifically, the gaps G between the plurality of second electrode fingers 43b2 and the plurality of first dummy electrode fingers 43a3 are superposed with the crossing region in the inner region D10 when viewed in the elastic wave propagation direction. Similarly, the gaps between the plurality of first electrode fingers 43a2 and the plurality of second dummy electrode fingers are superposed with the crossing region in the inner region D10.

Figure 16:
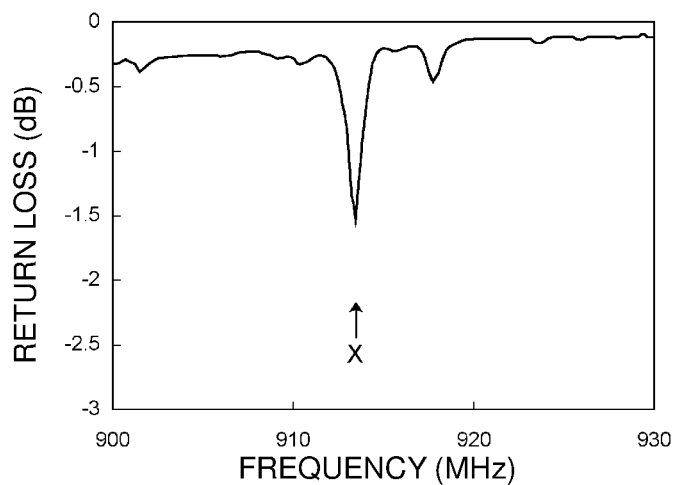
FIG. 16 is a diagram illustrating the return loss of an elastic wave device according to the fifth preferred embodiment of the present invention.

FIG. 16 is a diagram illustrating the return loss of the elastic wave device according to the fifth preferred embodiment.

As illustrated in FIG. 16, in the present preferred embodiment, the return loss of the shear horizontal wave is improved to about 1.54 dB. Thus, a shear horizontal wave is further reduced or prevented. On the other hand, it is difficult for a Rayleigh wave to leak.

Figure 17:
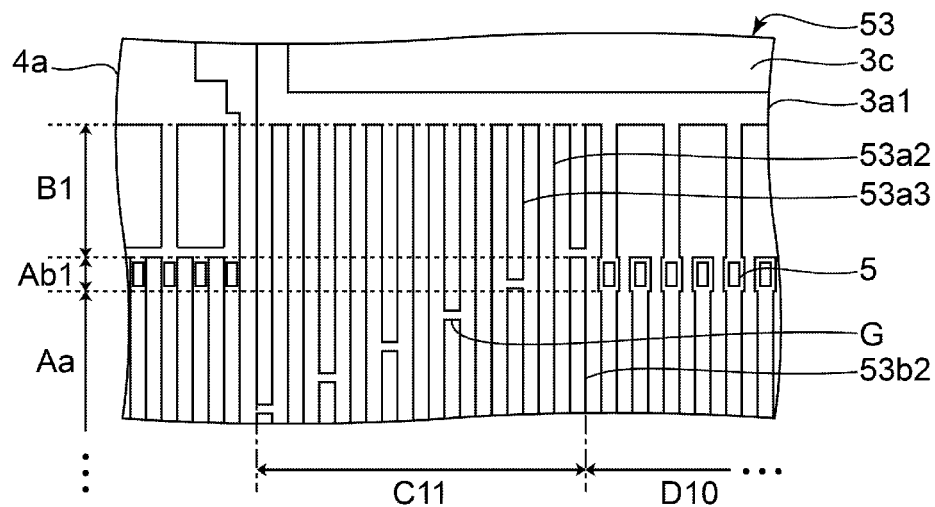
FIG. 17 is an enlarged plan view of the vicinity of a first end region of an IDT electrode in a sixth preferred embodiment of the present invention.

FIG. 17 is an enlarged plan view of the vicinity of a first end region of an IDT electrode in a sixth preferred embodiment of the present invention.

An elastic wave device according to the sixth preferred embodiment differs from the fourth preferred embodiment in that first dummy electrode fingers 53a3 and second dummy electrode fingers become increasingly longer in a first end region C11 and a second end region of an IDT electrode 53 the closer the dummy electrode fingers are to the outside in the elastic wave propagation direction. In other respects, the elastic wave device according to the sixth preferred embodiment has the same or substantially the same configuration as the elastic wave device 31 of the fourth preferred embodiment.

More specifically, the lengths of the plurality of first dummy electrode fingers 53a3 are different from each other in the first end region C11 and the lengths of the plurality of first dummy electrode fingers 53a3 are different from each other in the second end region. Similarly, the lengths of the plurality of second dummy electrode fingers are different from each other in the first end region C11 and the lengths of the plurality of second dummy electrode fingers are different from each other in the second end region. In this state, as described above, the first dummy electrode fingers 53a3 and the second dummy electrode fingers become increasingly longer in the first end region C11 and the second end region the closer the dummy electrode fingers are to the outside in the elastic wave propagation direction.

Gaps G between a plurality of second electrode fingers 53b2 and the plurality of first dummy electrode fingers 53a3 are superposed with a first high-acoustic-velocity region B1 and the crossing region in the inner region D10 when viewed in the elastic wave propagation direction. Similarly, gaps between a plurality of first electrode fingers 53a2 and the plurality of second dummy electrode fingers are superposed with a second high-acoustic-velocity region and the crossing region in the inner region D10 when viewed in the elastic wave propagation direction. However, the positions of the gaps are not particularly limited, and for example, all of the gaps may be superposed with the crossing region in the inner region D10 when viewed in the elastic wave propagation direction.

Figure 18:
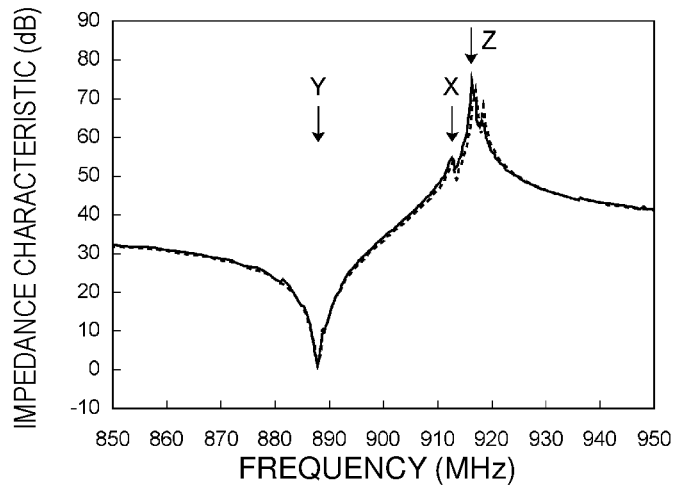
FIG. 18 is a diagram illustrating the impedance-frequency characteristics of elastic wave devices of the sixth preferred embodiment of the present invention and a comparative example.
Figure 19:
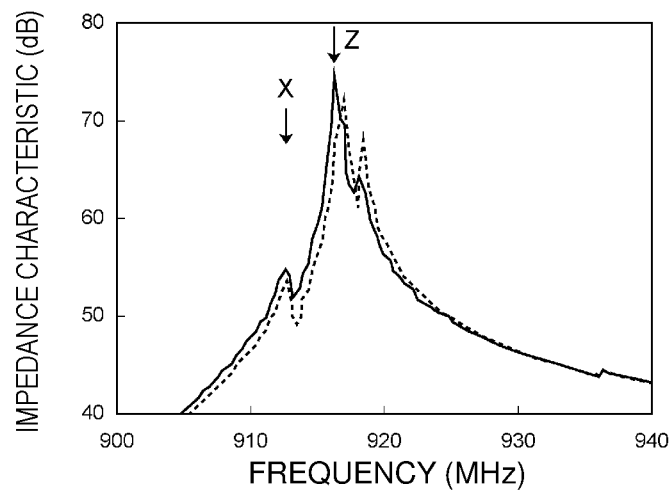
FIG. 19 is an enlargement of FIG. 18.
Figure 20:
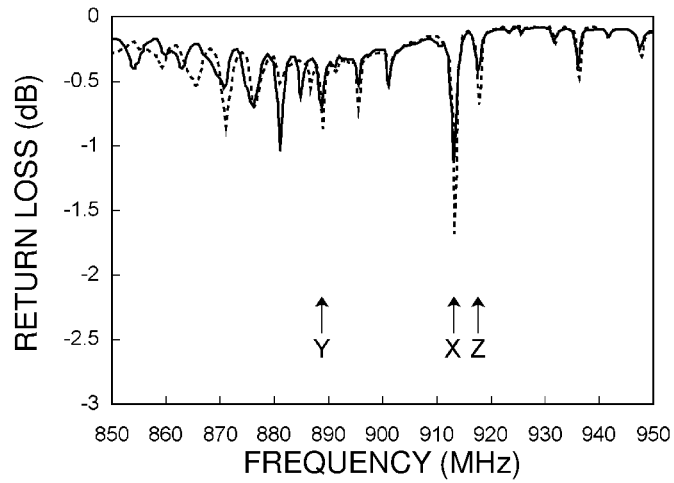
FIG. 20 is a diagram illustrating the return losses of elastic wave devices according to the sixth preferred embodiment of the present invention and the comparative example.

FIG. 18 is a diagram illustrating the impedance-frequency characteristics of elastic wave devices of the sixth preferred embodiment of the present invention and a comparative example. FIG. 19 is an enlargement of FIG. 18. FIG. 20 is a diagram illustrating the return losses of the elastic wave devices according to the sixth preferred embodiment and the comparative example. In FIGS. 18 to 20, solid lines represent results of the sixth preferred embodiment and broken lines represent results of the comparative example. Arrows Y in FIGS. 18 and 20 indicate resonant frequencies and arrows Z in FIGS. 18 to 20 indicate anti-resonant frequencies. In addition, the comparative example that will be compared with the sixth preferred embodiment is the same as the comparative example compared with the first preferred embodiment described above.

As illustrated in FIGS. 18 to 20, it is clear that the shear horizontal wave is reduced in the present preferred embodiment compared with the comparative example. In addition, as illustrated in FIG. 20, it is clear that the return loss other than for the shear horizontal wave, which is an unwanted wave, is substantially the same in the sixth preferred embodiment and the comparative example in the frequency band between the resonant frequency and the anti-resonant frequency. Thus, in the present preferred embodiment, the elastic wave that is to be utilized is effectively confined and an unwanted wave is reduced or prevented.

In addition, preferred embodiments of the present invention may also be applied to an elastic wave device that utilizes a Love wave piston mode. In this case, the unwanted wave is a shear vertical wave. Therefore, the return loss of a shear vertical wave, which is an unwanted wave, is improved by an elastic wave device that utilizes a Love wave piston mode and to which preferred embodiments of the present invention have been applied.

The elastic wave devices of the above-described preferred embodiments may be used as a duplexer of a high-frequency front end circuit, for example. An example of this will be described hereafter.

Figure 21:
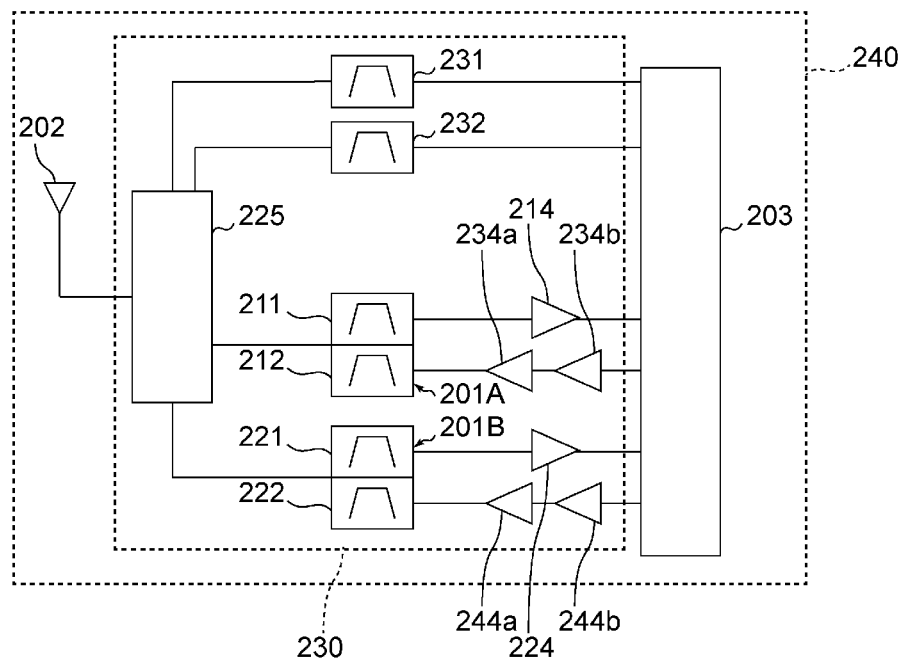
FIG. 21 is a diagram illustrating the configurations of a communication device and a high-frequency front end circuit according to preferred embodiments of the present invention.

FIG. 21 is a configuration diagram of a communication device and a high-frequency front end circuit according to a preferred embodiment of the present invention. In FIG. 21, elements connected to a high-frequency front end circuit 230, such as an antenna element 202, and an RF signal processing circuit (RFIC) 203 are also illustrated. The high-frequency front end circuit 230 and the RF signal processing circuit 203 define a communication device 240. The communication device 240 may further include a power source, a CPU, and a display.

The high-frequency front end circuit 230 includes a switch 225, duplexers 201A and 201B, filters 231 and 232, low-noise amplifier circuits 214 and 224, and power amplifier circuits 234a, 234b, 244a, and 244b. The high-frequency front end circuit 230 and the communication device 240 illustrated in FIG. 21 are merely examples of a high-frequency front end circuit and a communication device, and the present invention is not limited to these configurations.

The duplexer 201A includes filters 211 and 212. The duplexer 201B includes filters 221 and 222. The duplexers 201A and 201B are connected to the antenna element 202 via the switch 225. The elastic wave devices may be used for the duplexers 201A and 201B and the filters 211, 212, 221, and 222.

In addition, the above-described elastic wave devices may also be applied to a multiplexer including 3 or more filters, such as a triplexer in which three filters are commonly connected to an antenna element or a hexaplexer in which six filters are commonly connected to an antenna element.

In other words, the above-described elastic wave devices may be applied to an elastic wave resonator, a filter, a duplexer, and a multiplexer including three or more filters. In addition, such a multiplexer is not limited to having a configuration that includes both a transmission filter and a reception filter, and may instead have a configuration that includes only a transmission filter or only a reception filter.

The switch 225 connects the antenna element 202 and a signal path corresponding to a prescribed band to each other in accordance with a control signal from a control unit (not illustrated), and is, for example, a single pole double throw (SPDT) switch. In addition, the number of signal paths connected to the antenna element 202 is not limited to one and may be a plurality. In other words, the high-frequency front end circuit 230 may support carrier aggregation.

The low-noise amplifier circuit 214 is a reception amplification circuit that amplifies a high-frequency signal (in this case, a high-frequency reception signal) received via the antenna element 202, the switch 225, and the duplexer 201A and outputs the amplified signal to the RF signal processing circuit 203. The low-noise amplifier circuit 224 is a reception amplification circuit that amplifies a high-frequency signal (in this case, a high-frequency reception signal) received via the antenna element 202, the switch 225, and the duplexer 201B and outputs the amplified signal to the RF signal processing circuit 203.

The power amplifier circuits 234a and 234b are transmission amplification circuits that amplify a high-frequency signal (here, high-frequency transmission signal) output from the RF signal processing circuit 203 and output the amplified high-frequency signal to the antenna element 202 via the duplexer 201A and the switch 225. The power amplifier circuits 244*a* and 244*b* are transmission amplification circuits that amplify a high-frequency signal (here, high-frequency transmission signal) output from the RF signal processing circuit 203 and output the amplified high-frequency signal to the antenna element 202 via the duplexer 201B and the switch 225.

The RF signal processing circuit 203 subjects a high-frequency reception signal input thereto from the antenna element 202 via a reception signal path to signal processing using down conversion, for example, and outputs a reception signal generated through this signal processing. In addition, the RF signal processing circuit 203 subjects an input transmission signal to signal processing using up conversion, for example, and outputs a high-frequency transmission signal generated through this signal processing to the power amplifier circuit 234*a*, 234*b*, 244*a* and 244*b*. The RF signal processing circuit 203 is preferably an RFIC, for example. The RF signal processing circuit 203 is connected to a baseband signal processing circuit, for example. In this case, a signal processed by the RF signal processing circuit 203 is input to the baseband signal processing circuit. A signal processed by the baseband signal processing circuit is used for image display as an image signal or for a phone call as an audio signal, for example.

In the above-described case, the baseband signal processing circuit is included in the communication device 240. In addition, the high-frequency front end circuit 230 may include other circuit elements between the above-described elements.

Furthermore, the high-frequency front end circuit 230 may include duplexers according to modifications of the duplexers 201A and 201B, instead of the duplexers 201A and 201B.

On the other hand, the filters 231 and 232 of the communication device 240 are connected between the RF signal processing circuit 203 and the switch 225 without any low-noise amplifier circuits or power amplifier circuits interposed therebetween. The filters 231 and 232 are also connected to the antenna element 202 via the switch 225 similarly to the duplexers 201A and 201B.

The high-frequency front end circuit 230 and communication device 240 effectively confines an elastic wave that is to be utilized and reduces or prevents an unwanted wave as a result of being equipped with an elastic wave resonator, a filter, a duplexer, a multiplexer including three or more filters, and other suitable components, which are achieved by using an elastic wave device according to a preferred embodiment of the present invention.

Elastic wave devices, high-frequency front end circuits, and communication devices according to the present invention have been described above with reference to preferred embodiments and modifications thereof, but other preferred embodiments achieved by combining any of the elements of the above-described preferred embodiments and modifications with one another, modifications obtained by modifying the above-described preferred embodiments in various ways, as conceived by one skilled in the art, without departing from the gist and scope of the present invention, and various devices including a high-frequency front end circuit and a communication device according to preferred embodiments the present invention built thereinto are also included in the present invention.

Preferred embodiments of the present invention may be widely used, for example, in communication devices, such as cellular phones, as an elastic wave resonator, a filter, a duplexer, a multiplexer that may be applied to multiband systems, a front end circuit, and a communication device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric body; and
an IDT electrode provided on the piezoelectric body; wherein
the IDT electrode includes a first busbar and a second busbar that face each other, a plurality of first electrode fingers including first ends that are connected to the first busbar, and a plurality of second electrode fingers including first ends that are connected to the second busbar and that are interdigitated with the plurality of first electrode fingers, includes a first end region that includes one end of the IDT electrode in an elastic wave propagation direction, a second end region that includes another end of the IDT electrode in the elastic wave propagation direction, and an inner region that is located inside of the first end region and the second end region in the elastic wave propagation direction, includes a crossing region that is a portion of the IDT electrode in which the first electrode fingers and the second electrode fingers are superposed with each other in the elastic wave propagation direction, and when a direction in which the first electrode fingers and the second electrode fingers extend is referred to as a length direction, in the crossing region in at least the inner region, the IDT electrode includes a center region that is centrally located in the length direction and a first low-acoustic-velocity region and a second low-acoustic-velocity region on both sides of the center region in the length direction and in which an acoustic velocity is lower than in the center region, and the IDT electrode includes a first high-acoustic-velocity region between the first busbar and the first low-acoustic-velocity region and in which an acoustic velocity is higher than in the center region and a second high-acoustic-velocity region between the second busbar and the second low-acoustic-velocity region and in which an acoustic velocity is higher than in the center region; and
at least one of a mass of the IDT electrode in the crossing region in the first end region or a mass of the IDT electrode in the crossing region in the second end region is smaller than a mass of the IDT electrode in the crossing region in the inner region.

2. The elastic wave device according to claim 1, wherein the IDT electrode includes the center region, the first low-acoustic-velocity region, and the second low-acoustic-velocity region in the crossing region in the inner region, the first end region, and the second end region.

3. The elastic wave device according to claim 2, wherein a duty in the center region in at least one of the first end region or the second end region is smaller than a duty in the center region in the inner region.

4. The elastic wave device according to claim 2, wherein a duty closer to the first low-acoustic-velocity region and closer to the second low-acoustic-velocity region in the center region in at least one of the first end region or second end region is smaller than a duty in the center region in the inner region.

5. The elastic wave device according to claim 2, wherein, in the IDT electrode, a duty in the center region in at least one of the first end region or the second end region decreases in a direction toward to the outside in the elastic wave propagation direction.

6. The elastic wave device according to claim 2, wherein, in the IDT electrode, a duty in the first low-acoustic-velocity region and a duty in the second low-acoustic-velocity region in the first end region and the second end region are larger than duties in the center region in the first end region and the second end region.

7. The elastic wave device according to claim 2, wherein an additional mass film is stacked on a plurality of portions of the first end region and the second end region located in the first low-acoustic-velocity region and the second low-acoustic-velocity region.

8. The elastic wave device according to claim 1, wherein
    the IDT electrode includes a plurality of first dummy electrode fingers that include first ends connected to the first busbar, that face the plurality of second electrode fingers with gaps therebetween, and that are disposed in at least one of the first end region or the second end region, and a plurality of second dummy electrode fingers that include first ends connected to the second busbar, that face the plurality of first electrode fingers with gaps therebetween, and that are disposed in at least one of the first end region or the second end region; and
    the first low-acoustic-velocity region and the second low-acoustic-velocity region are not disposed in the first end region and the second end region.

9. The elastic wave device according to claim 8, wherein the gaps between the plurality of first electrode fingers and the plurality of second dummy electrode fingers are superposed with the crossing region in the inner region when viewed in the elastic wave propagation direction; and
    the gaps between the plurality of second electrode fingers and the plurality of first dummy electrode fingers are superposed with the crossing region in the inner region when viewed in the elastic wave propagation direction.

10. The elastic wave device according to claim 8, wherein
    the mass of the IDT electrode in the crossing region in the first end region and the mass of the IDT electrode in the crossing region in the second end region are smaller than the mass of the IDT electrode in the crossing region in the inner region;
    the first dummy electrode fingers and the second dummy electrode fingers are disposed in the first end region and the second end region; and
    the plurality of first dummy electrode fingers have different lengths from each other in the first end region, the plurality of first dummy electrode fingers have different lengths from each other in the second end region, the plurality of second dummy electrode fingers have different lengths from each other in the first end region, and the plurality of second dummy electrode fingers have different lengths from each other in the second end region, and the lengths of the plurality of first dummy electrode fingers and the lengths of the second dummy electrode fingers increase the closer the dummy electrode fingers are to outside in the elastic wave propagation direction.

11. The elastic wave device according to claim 1, wherein the mass of the IDT electrode in the crossing region in the first end region and the mass of the IDT electrode in the crossing region in the second end region are smaller than the mass of the IDT electrode in the crossing region in the inner region.

12. The elastic wave device according to claim 1, wherein an area of the first end region and an area of the second end region each occupy about 2% to about 5% of an area of the IDT electrode.

13. The elastic wave device according to claim 1, wherein a Rayleigh wave is utilized.

14. A high-frequency front end circuit comprising:
    the elastic wave device according to claim 1; and
    a power amplifier.

15. The high-frequency front end circuit according to claim 14, wherein the IDT electrode includes the center region, the first low-acoustic-velocity region, and the second low-acoustic-velocity region in the crossing region in the inner region, the first end region, and the second end region.

16. The high-frequency front end circuit according to claim 15, wherein a duty in the center region in at least one of the first end region or the second end region is smaller than a duty in the center region in the inner region.

17. The high-frequency front end circuit according to claim 15, wherein a duty closer to the first low-acoustic-velocity region and closer to the second low-acoustic-velocity region in the center region in at least one of the first end region or second end region is smaller than a duty in the center region in the inner region.

18. The high-frequency front end circuit according to claim 15, wherein, in the IDT electrode, a duty in the center region in at least one of the first end region or the second end region decreases in a direction toward to the outside in the elastic wave propagation direction.

19. The high-frequency front end circuit according to claim 15, wherein, in the IDT electrode, a duty in the first low-acoustic-velocity region and a duty in the second low-acoustic-velocity region in the first end region and the second end region are larger than duties in the center region in the first end region and the second end region.

20. A communication device comprising:
    the high-frequency front end circuit according to claim 14; and
    an RF signal processing circuit.

* * * * *